US012700468B2

(12) United States Patent  
  Quinsat et al.

(10) Patent No.: US 12,700,468 B2  
(45) Date of Patent: Aug. 4, 2026

(54) MAGNETIC MEMORY

(71) Applicant: Kioxia Corporation, Tokyo (JP)

(72) Inventors: Michael Arnaud Quinsat, Yokohama Kanagawa (JP); Naoharu Shimomura, Tokyo (JP); Yoshihiro Ueda, Yokohama Kanagawa (JP); Tsuyoshi Kondo, Kawasaki Kanagawa (JP); Nobuyuki Umetsu, Kawasaki Kanagawa (JP); Susumu Hashimoto, Tokyo (JP); Jun Iwata, Kawasaki Kanagawa (JP); Tomoe Nishimura, Yokohama Kanagawa (JP); Masaki Kado, Kamakura Kanagawa (JP); Tsutomu Nakanishi, Yokohama Kanagawa (JP); Yasuaki Ootera, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 156 days.

(21) Appl. No.: 18/829,883

(22) Filed: Sep. 10, 2024

(65) Prior Publication Data

US 2025/0246254 A1     Jul. 31, 2025

(30) Foreign Application Priority Data

Jan. 29, 2024    (JP) ................................. 2024-011132

(51) Int. Cl.  
   *G11C 11/16*      (2006.01)  
   *G11C 19/08*      (2006.01)  
        (Continued)

(52) U.S. Cl.  
   CPC ........ *G11C 19/0841* (2013.01); *G11C 11/161* (2013.01); *G11C 11/1673* (2013.01);  
        (Continued)

(58) Field of Classification Search  
   CPC .............. G11C 19/0841; G11C 11/161; G11C 11/1673; G11C 11/1675; G11C 11/169; H10B 61/22; H10N 50/10  
   See application file for complete search history.

(56) References Cited

U.S. PATENT DOCUMENTS 8,750,012 B1     6/2014  Abraham et al.  
11,871,586 B2    1/2024  Shimomura et al.  
             (Continued)

FOREIGN PATENT DOCUMENTS

JP       2023-37504 A     3/2023  
JP       2023-127466 A    9/2023

OTHER PUBLICATIONS

M.P. Proenca et al., "Deterministic and time resolved thermomagnetic switching in a nickel nanowire," Scientific Reports, vol. 9, No. 17339, (2019) DOI: 10.1038/s41598-019-54043-y, 8 pages (2019).

*Primary Examiner* — Min Huang  
(74) *Attorney, Agent, or Firm* — Finnegan, Henderson, Farabow, Garrett & Dunner, LLP

(57)              ABSTRACT

According to one embodiment, a magnetic memory includes: a magnet configured to store data and shift the data from a first area to a second area by domain wall movement caused by a shift operation; an interconnect spaced apart from the magnet and configured to apply a write field to the magnet at a time of a write operation; and a control circuit configured to cause a shift current for shifting the data to flow in the magnet and to cause a write current for generating the write field to flow in the interconnect, wherein the write current includes a first pulse supplied to the interconnect and a second pulse supplied to the interconnect after the first pulse, and a pulse width of the second pulse is smaller than a pulse width of the first pulse.

16 Claims, 10 Drawing Sheets

(51) Int. Cl.
    *H10B 61/00*       (2023.01)
    *H10N 50/10*       (2023.01)

(52) U.S. Cl.
    CPC ...... *G11C 11/1675* (2013.01); *G11C 11/1693* (2013.01); *H10B 61/22* (2023.02); *H10N 50/10* (2023.02)

(56)          References Cited

U.S. PATENT DOCUMENTS

| | | | |
|---|---|---|---|
| 2019/0245136 A1* | 8/2019 | Choi | H10N 50/01 |
| 2019/0287598 A1* | 9/2019 | Shimada | G11C 19/0841 |
| 2021/0249061 A1* | 8/2021 | Arnaud Quinsat | G11C 19/0841 |
| 2021/0295889 A1* | 9/2021 | Koike | G11C 11/1659 |
| 2021/0305230 A1* | 9/2021 | Okajima | H10B 61/10 |
| 2022/0076723 A1 | 3/2022 | Shimomura et al. | |
| 2022/0293678 A1* | 9/2022 | Ueda | H10N 50/10 |
| 2023/0309321 A1 | 9/2023 | Shimomura et al. | |

* cited by examiner

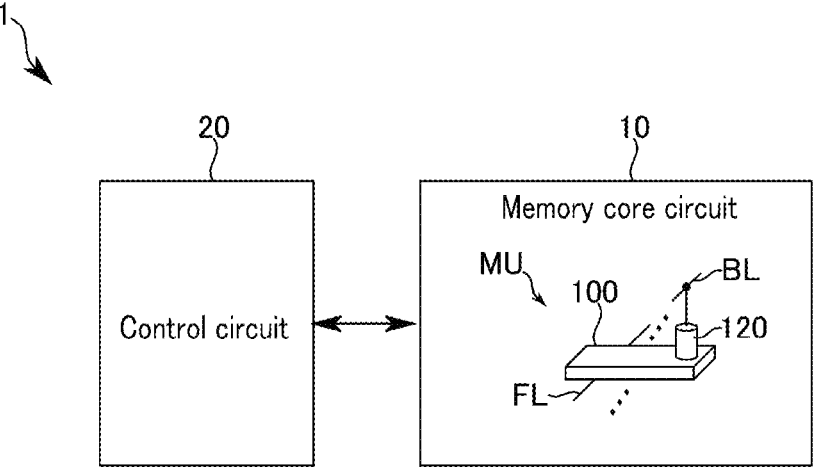
F I G. 1

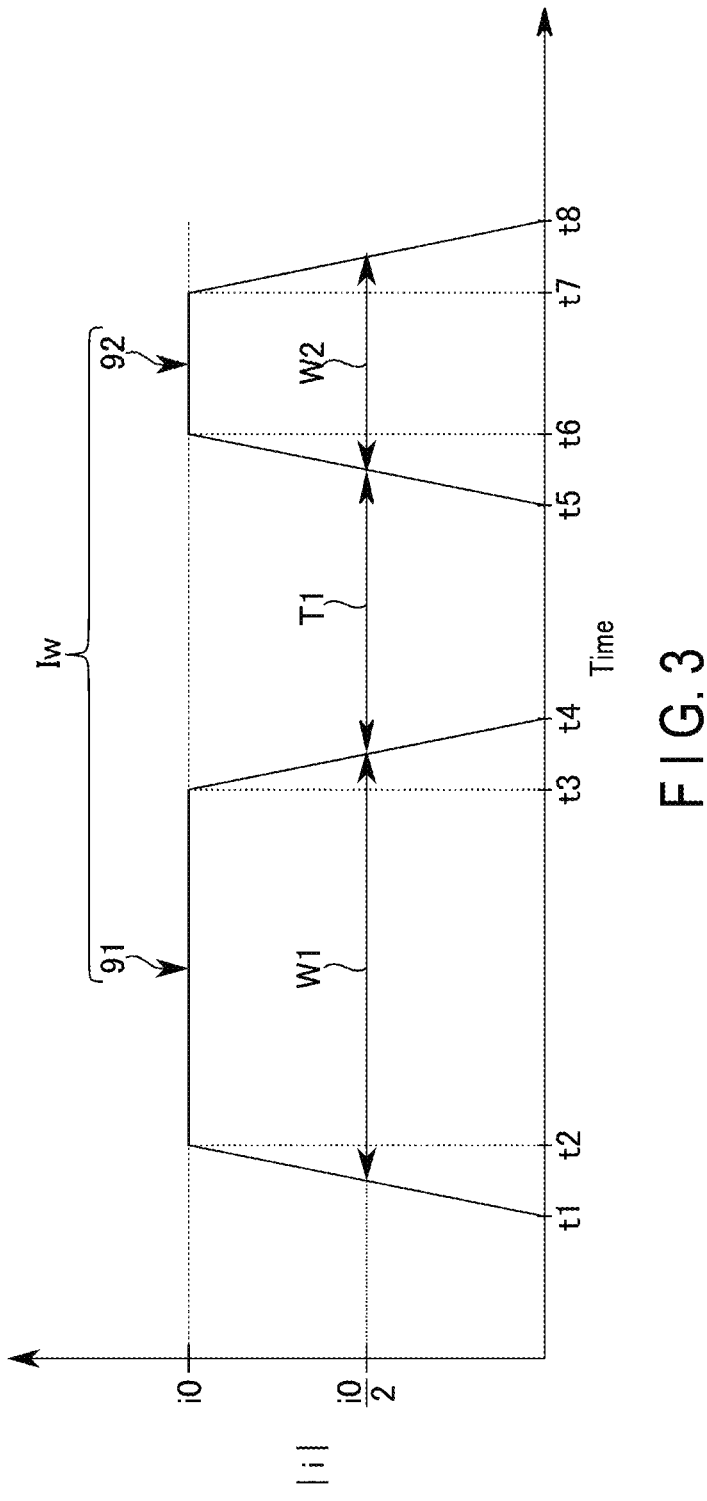
F I G. 3

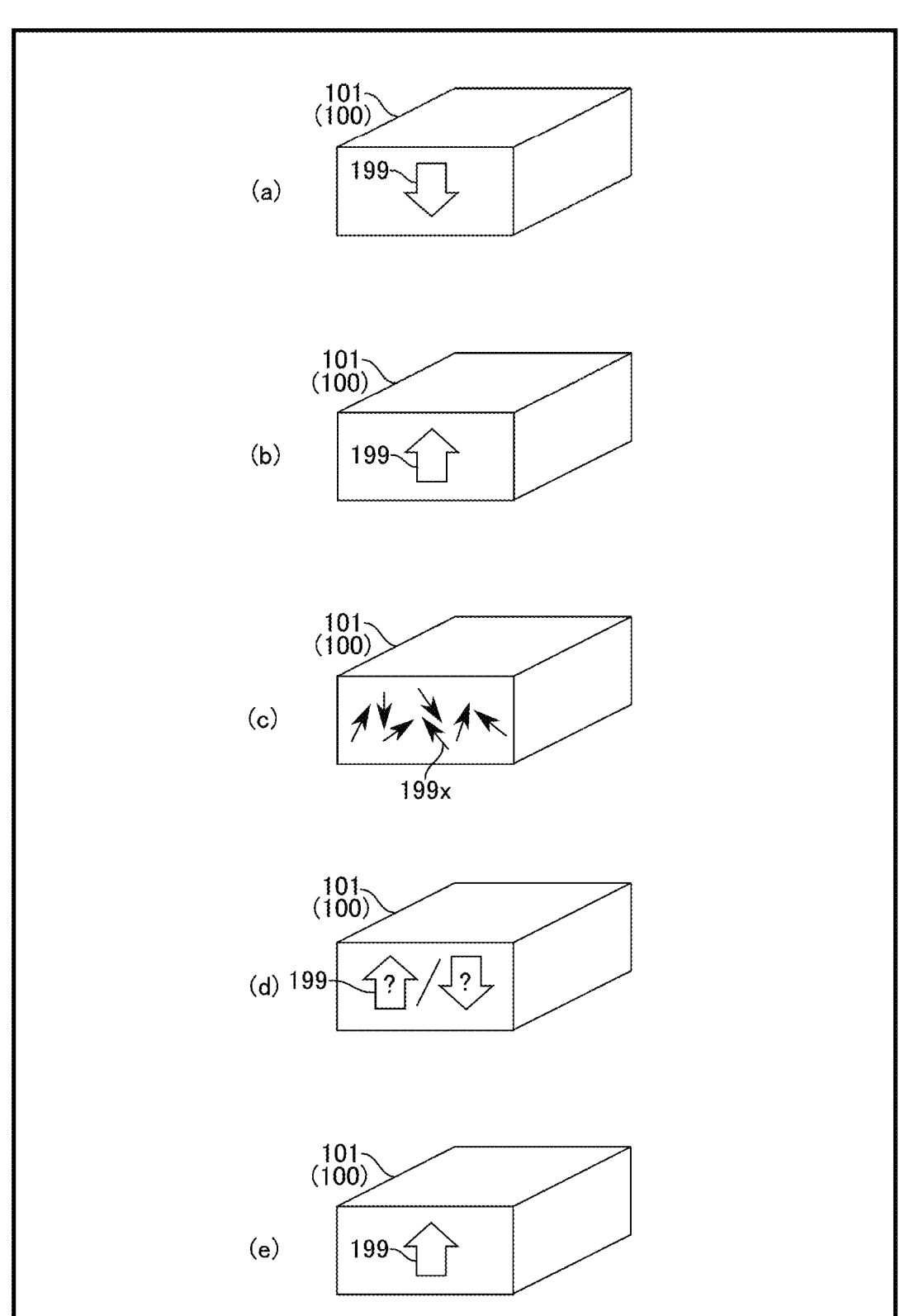
F I G. 4

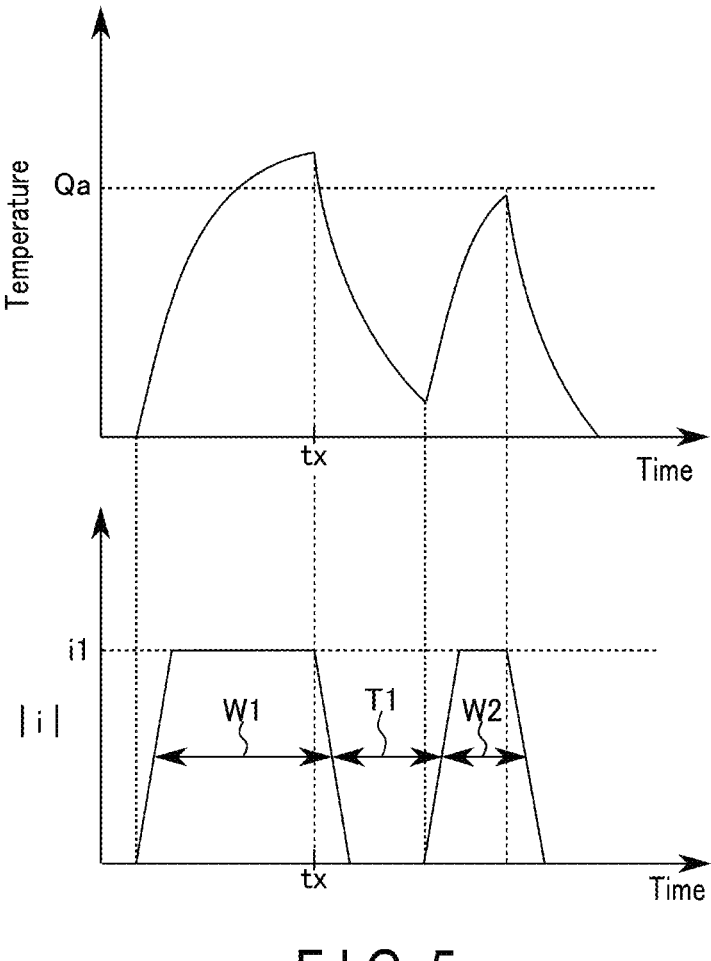
F I G. 5

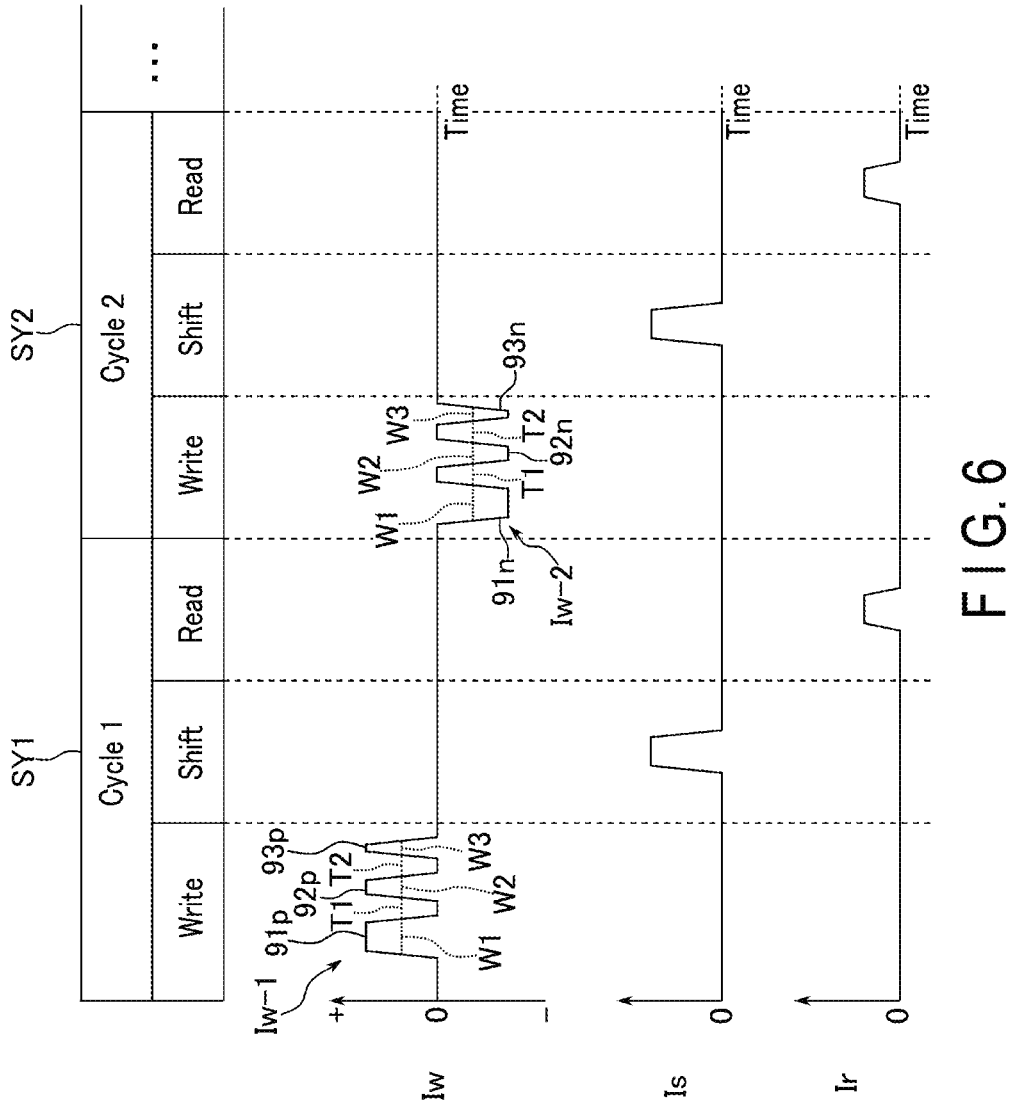
F I G. 6

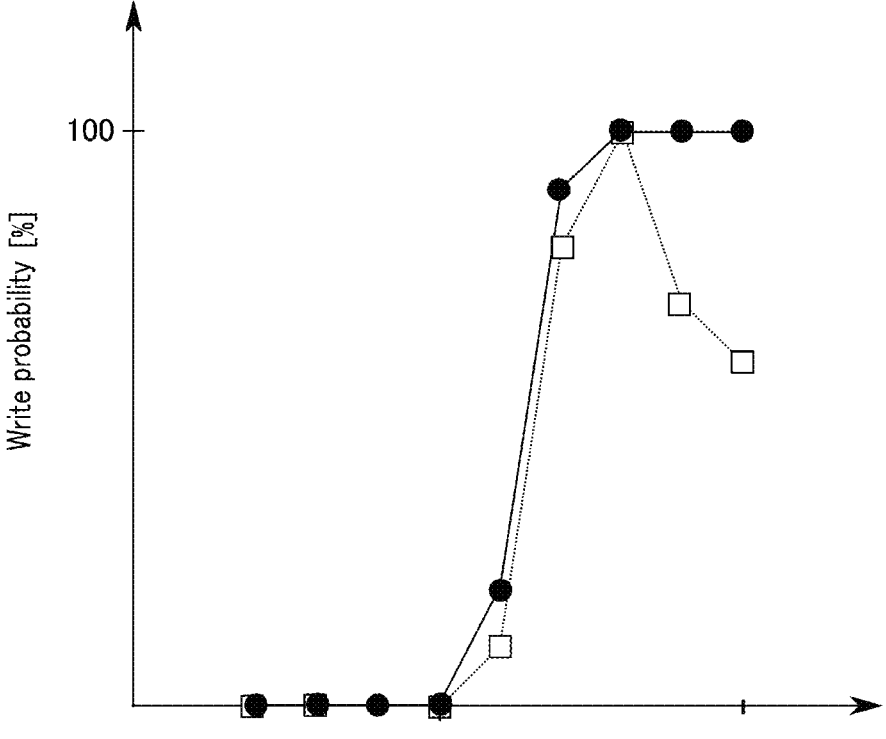
F I G. 7

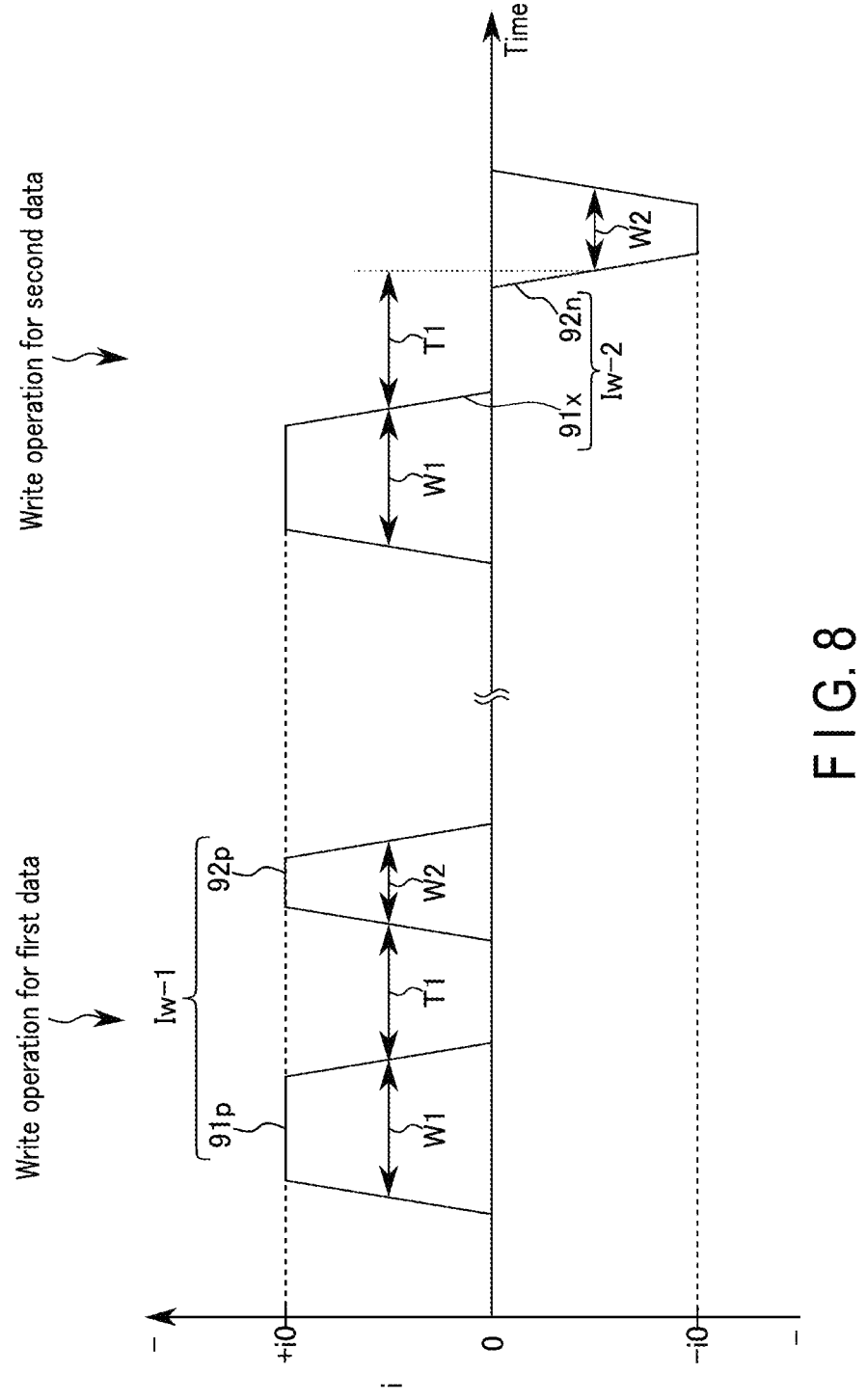
F I G . 8

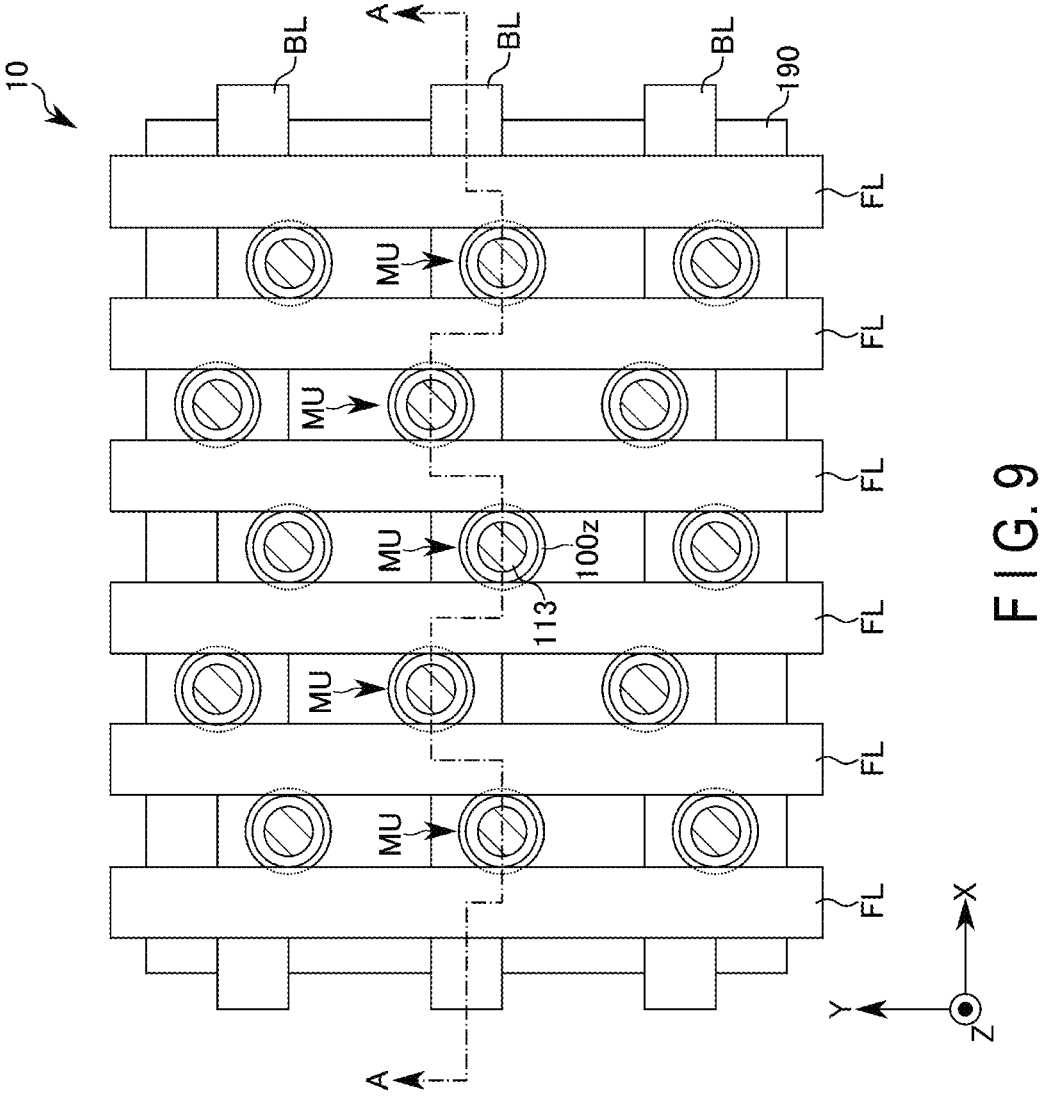
F I G. 9

MAGNETIC MEMORY

CROSS-REFERENCE TO RELATED APPLICATIONS

This application is based upon and claims the benefit of priority from prior Japanese Patent Application No. 2024-011132, filed Jan. 29, 2024, the entire contents of which are incorporated herein by reference.

FIELD

Embodiments described herein relate generally to a magnetic memory.

BACKGROUND

There is known a magnetic memory that implements a function as a memory device by domain wall displacement (movement) in a magnet which is caused by a current flowing in the magnet.

BRIEF DESCRIPTION OF THE DRAWINGS

FIG. 1 is a block diagram showing an example of the arrangement of a magnetic memory according to the first embodiment.

FIG. 3 is a waveform chart showing a write current in the magnetic memory according to the first embodiment.

FIG. 4 is a view schematically showing the magnetization state of a magnet at the time of the write operation of the magnetic memory according to the first embodiment.

FIG. 5 is a graph showing a change in the temperature of the magnet at the time of the write operation of the magnetic memory according to the first embodiment.

FIG. 6 is a graph showing an example of the operation of the magnetic memory according to the first embodiment.

FIG. 7 is a graph showing experimental results on the magnetic memory according to the first embodiment.

FIG. 8 is a waveform chart showing a write current in a magnetic memory according to the second embodiment.

FIG. 9 is a plan view showing an example of the structure of a magnetic memory according to the third embodiment.

DETAILED DESCRIPTION

Figure 2:
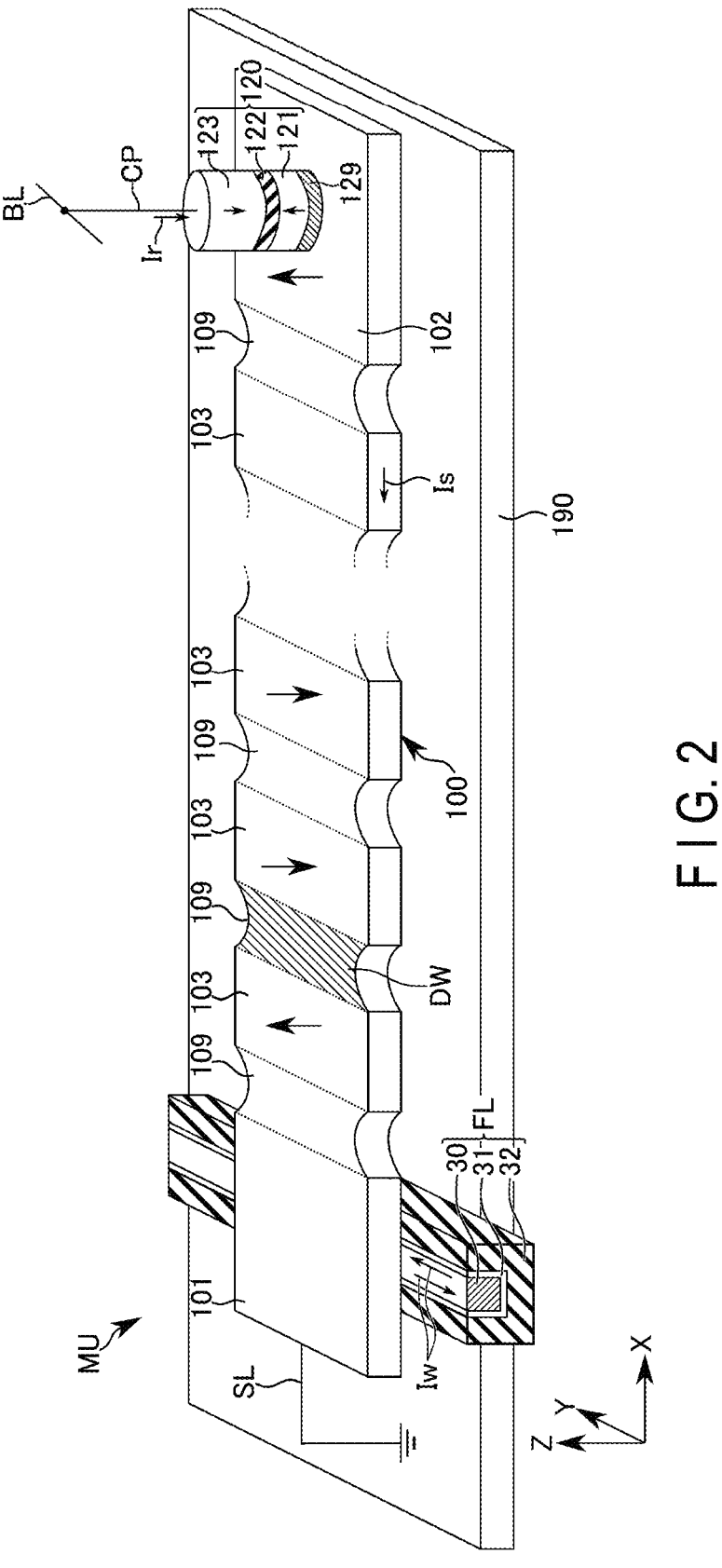
FIG. 2 is a view showing the basic arrangement of a memory unit of the magnetic memory according to the first embodiment.

A magnetic memory according to an embodiment will be described with reference to FIGS. 1, 2, 3, 4, 5, 6, 7, 8, 9, and 10. The same reference numerals denote elements having the same functions and arrangements. If constituent elements (for example, circuits, interconnects (wirings), and various types of voltages and signals) with reference numerals suffixed with numbers/letters for discrimination need not be discriminated from each other, notations (reference numerals) without suffixed numbers/letters will be used.

In general, according to one embodiment, a magnetic memory includes: a magnet configured to store data and shift the data from a first area to a second area by domain wall movement caused by a shift operation; a first interconnect spaced apart from the magnet and configured to apply a first write field to the magnet at a time of a write operation;

and a control circuit configured to cause a shift current for shifting the data to flow in the magnet and to cause a write current for generating the first write field to flow in the first interconnect, wherein the write current includes a first pulse supplied to the first interconnect and a second pulse supplied to the first interconnect after the first pulse, and a pulse width of the second pulse is smaller than a pulse width of the first pulse.

(1) First Embodiment

A magnetic memory according to the first embodiment will be described with reference to FIGS. 1, 2, 3, 4, 5, 6, and 7.

(a) Example of Arrangement

FIG. 1 is a block diagram showing an example of the arrangement of the magnetic memory according to the embodiment.

As shown in FIG. 1, a magnetic memory 1 according to the embodiment includes a memory core circuit 10 and a control circuit 20.

The memory core circuit 10 stores data. The memory core circuit 10 includes a plurality of magnets 100 and a plurality of interconnects FL and BL. The magnet 100 is a constituent element of a memory unit MU functioning as a data storage unit. The internal arrangement of the memory core circuit 10 will be described later.

The control circuit 20 is electrically connected to the memory core circuit 10. The control circuit 20 controls various types of memory operations of the memory core circuit 10. For example, the control circuit 20 controls a write operation, a shift operation, and a read operation with respect to the memory core circuit 10.

The magnetic memory 1 according to this embodiment is a magnetic memory that implements a function as a memory device by using domain wall displacement (shift or movement). The magnetic memory 1 according to the embodiment is also called a domain wall shift memory or a race track memory.

FIG. 2 is a schematic view for explaining an example of the arrangement of the memory core circuit 10 of the magnetic memory 1 according to the embodiment. FIG. 2 exemplarily shows the basic arrangement of the memory unit MU including the magnet 100.

The memory unit MU includes at least the magnet 100 and a read element 120. A field line FL, a bit line BL, and a source line SL are provided for the memory unit MU.

The magnet 100 is provided above a substrate 190. The magnet 100 is a data storage unit. The magnet 100 has a plate-like structure extending in the X direction. The X direction is a direction parallel to the surface of the substrate 190. The magnet 100 has vertical magnetic anisotropy. The magnet 100 is magnetized in a direction (Z direction) perpendicular to the surface of the substrate 190.

The magnet 100 includes a plurality of areas 101, 102, and 103. The plurality of areas 101, 102, and 103 are arrayed in the X direction. The plurality of areas 101, 102, and 103 are continuous.

The area 101 is provided at one end of the magnet 100 in the X direction. The area 101 is a write area. The write area 101 is an area where a magnetic field for writing data is applied. The direction of the magnetization of the write area 101 is controlled in accordance with data to be written.

The area 102 is provided at the other end of the magnet 100 in the X direction. The area 102 is a read area. Target read data is transferred into the read area 102.

The plurality of areas 103 are provided between the write area 101 and the read area 102. The areas 103 are cell areas. Each cell area 103 functions as a memory cell storing 1-bit data. Each cell area 103 includes one magnetic domain. A domain wall DW is formed at the boundary portion of adjacent magnetic domains (the boundary portion between two areas having different magnetization directions). One magnetic domain sometimes strides over two or more adjacent cell areas 103 in accordance with data to be stored.

The magnet 100 may include constricted portions 109 at the boundary portions of the respective areas 101, 102, and 103. The size of the constricted portion 109 in the Y direction is smaller than that of the cell area 103 in the Y direction. The size of the constricted portion 109 in the X direction is smaller than that of the cell area 103 in the X direction. The domain wall DW tends to stop at the position of the constricted portion 109 having a relatively small volume inside the magnet 100. At the time of storing data, the domain wall DW exists in the constricted portion 109. At the time of a data shift operation, the domain wall DW is displaced from a given one of the constricted portions 109 to another constricted portion 109 through the cell area 103.

The field line FL as an interconnect is provided below the write area 101 of the magnet 100 in the Z direction. The field line FL extends in the Y direction parallel to the surface of the substrate 190. For example, the Y direction is orthogonal to the X direction. The field line FL is spaced apart from the magnet 100. A given interval is provided between the field line FL and the magnet 100. At the time of a data write operation, a write current is supplied into the field line FL. Supplying a write current will generate a magnetic field (write magnetic field) applied to the write area 101 around the field line FL. The field line FL is also called a write interconnect.

The field line FL includes a metal interconnect 30, a yoke (magnet) 31, and a thermal resistance layer 32. For example, the surfaces of the metal interconnect 30 other than the surface facing the magnet 100 are covered with the thermal resistance layer 32. However, all the surfaces of the metal interconnect 30 may be covered with the thermal resistance layer 32. The yoke 31 is provided between the metal interconnect 30 and the thermal resistance layer 32. The metal interconnect 30 includes, for example, copper (Cu), tungsten (W), or aluminum (Al). The yoke 31 includes, for example, iron (Fe), nickel (Ni), copper (Cu), or molybdenum (Mo). The thermal resistance layer 32 is formed from, for example, a material having high thermal resistance. The thermal resistance layer 32 contains, for example, silicon oxide ($SiO_2$), aluminum oxide ($AlO_x$), or silicon nitride (SiN).

Covering the surfaces of the metal interconnect 30 which do not face the magnet 100 with the thermal resistance layer 32 can efficiently propagate heat generated from the field line FL to the magnet 100. This makes it possible to raise the temperature of the write area 101 of the magnet 100 using a write current Iw having a relatively small current value. As a result, the magnetic memory 1 according to this embodiment can write data by using the write current Iw having a low current value (described later). Accordingly, the magnetic memory 1 according to the embodiment can reduce the power consumption.

The read element 120 is provided above the read area 102 of the magnet 100 in the Z direction. For example, a nonmagnetic conductive layer 129 is provided between the read element 120 and the read area 102. The read element 120 is electrically connected to the read area 102 through the nonmagnetic conductive layer 129. The read element 120 reads data shifted into the read area 102.

The read element 120 is based on a magnetoresistive effect element such as magnetic tunnel junction (MTJ) element having a tunneling magnetoresistance effect. When the read element 120 is an MTJ element, the read element 120 includes at least a storage layer 121, a tunnel barrier layer 122, and a reference layer 123. The storage layer 121 and the reference layer 123 form an MTJ through the tunnel barrier layer 122. The storage layer 121 and the reference layer 123 are magnetic layers. The storage layer 121 and the reference layer 123 include, for example, cobalt, iron, and boron. The tunnel barrier layer 122 is a nonmagnetic layer. The tunnel barrier layer 122 includes, for example, magnesium oxide.

The storage layer 121 is provided above the read area 102 of the magnet 100 in the Z direction through the nonmagnetic conductive layer 129. The reference layer 123 is provided above the storage layer 121 in the Z direction. The tunnel barrier layer 122 is provided between the storage layer 121 and the reference layer 123.

The magnetization direction of the storage layer 121 is variable. The magnetization direction of the storage layer 121 changes in accordance with the stray field of the magnetization of the read area 102.

The magnetization direction of the reference layer 123 is invariable. That "the magnetization direction of the reference layer 123 is invariable" means that the magnetization direction of the reference layer 123 does not change in accordance with stray field from the magnet 100.

The bit line BL is connected to the read element 120. For example, the bit line BL is connected to the reference layer 123 of the MTJ element 120 through a contact portion CP.

The source line SL is connected to the magnet 100. For example, the source line SL is connected to one end of the magnet 100 on the write area 101 side. A current flows between the bit line BL and the source line SL in accordance with the operation of the magnetic memory 1.

The magnetic memory 1 according to this embodiment is manufactured by a known technique. Accordingly, a description of a method of manufacturing the magnetic memory 1 according to the embodiment will be omitted.

In the magnetic memory 1 according to this embodiment, the control circuit 20 causes a shift current (drive current) Is to flow in the magnet 100. For example, when the shift current Is flows in the magnet 100 from the read area 102 to the write area 101, the domain wall DW in the magnet 100 is displaced from the write area 101 side to the read area 102 side. The distance that the domain wall DW is displaced is controlled in accordance with the pulse width (the supply period) and the current value of the shift current Is. The following is an example in which the domain wall DW is displaced in a direction opposite to the direction in which the shift current Is flows. It is possible to perform control such that the domain wall DW is displaced in the same direction as that in which the shift current Is flows in accordance with the material of the magnet 100, the members stacked on the magnet 100, or the manufacturing conditions for the magnet 100.

With a shift operation by the supply of the shift current Is, the data of the cell area 103 as a read target is shifted to the read area 102.

At the time of a read operation, a read current Ir is supplied to the read element 120. In the MTJ element 120 as a read element, the magnetization direction of the storage layer 121 corresponds to the magnetization direction of the read area 102 based on the stray field of the magnet 100. The resistance value of the MTJ element 120 changes in accordance with the relative relationship (magnetization array state) between the magnetization of the storage layer 121 and the magnetization of the reference layer 123. The magnetic resistance of the MTJ element 120 in a case where the magnetization direction of the storage layer 121 is the same as that of the reference layer 123 is different from the magnetic resistance of the MTJ element 120 in a case where the magnetization direction of the storage layer 121 is different from that of the reference layer 123. The resistance value of the MTJ element 120 changes in accordance with the data read to the read area 102. Data in the read area 102 is read based on the discrimination result on the resistance value of the MTJ element 120. The data in the read area 102 is discriminated based on the fluctuation amount of the read current Ir or the magnitude of a voltage corresponding to the magnitude of the magnetic resistance of the MTJ element 120.

At the time of writing data, the write current Iw is supplied to the field line FL. The write current generates a write field around the field line FL. The write field is applied to the write area 101. With this operation, the magnetization direction of the write area 101 is set in accordance with the magnetization direction of the write field. The direction of the write field corresponds to the flowing direction of the write current Iw. The flowing direction of the write current Iw is controlled in accordance with data to be written.

In the magnetic memory 1 according to this embodiment, at the time of a write operation, the control circuit 20 causes the write current Iw including a plurality of pulses to flow to the field line FL.

This makes it possible to improve the reliability of the magnetic memory 1 according to this embodiment at the time of writing data.

(b) Example of Operation

An example of the operation of the magnetic memory according to this embodiment will be described with reference to FIGS. 3, 4, 5, and 6.

(b-1) Basic Example of Write Current

FIG. 3 is a waveform chart showing a basic example of the write current Iw used for the write operation of the magnetic memory 1 according to this embodiment. The abscissa of the waveform chart of FIG. 3 corresponds to the time (pulse width). The ordinate of the waveform chart of FIG. 3 corresponds to the absolute value of a current value (pulse height) i of the write current Iw.

As shown in FIG. 3, in the magnetic memory 1 according to this embodiment, the write current Iw includes a plurality of pulses 91 and 92. FIG. 3 shows an example in which the write current Iw includes the two pulses 91 and 92. Note, however, that the write current Iw may include three or more pulses.

Of the write current Iw including the two pulses 91 and 92, the first pulse 91 is supplied first into the field line FL. After the first pulse 91 is supplied, the second pulse 92 is supplied into the field line FL.

The first pulse 91 and the second pulse 92 each have a current value i0. The current value of the second pulse 92 is substantially equal to the current value of the first pulse 91. However, the current value of the second pulse 92 may be different from that of the first pulse 91. For example, the current value of the second pulse 92 may be set to a current value within the range between the value 10% higher than the current value of the first pulse 91 and the value 10% lower than the current value of the first pulse 91.

A pulse width W1 of the first pulse 91 is equal to or less than 100 ns (nano second). A pulse width W2 of the second pulse 92 is smaller than the pulse width W1 of the first pulse 91. The pulse width W2 has a magnitude within the range between 2.5% or more of the pulse width W1 and 30% or less of the pulse width W1. For example, if the pulse width W1 is 100 ns, the pulse width W2 is 2.5 ns or more and 30 ns or less.

In this embodiment, the pulse width of a current is defined based on the full width at half maximum (FWHM). That is, the width of a pulse of the write current Iw at the position of a value (i0/2) half the maximum value (i0) of the current value of the write current Iw is regarded as the pulse width of the current (pulse). Note that the pulse width W1 of the first pulse 91 and the pulse width W2 of the second pulse 92 may be compared in magnitude as long as reference current values are based on a common definition. For example, the definition of pulse widths may be the pulse width at the maximum value of a current value, the pulse width at the value of 80% of a current value, or the pulse width at the value of 30% of a current value. The pulse width of the second pulse 92 is smaller than that of the first pulse 91 regardless of any reference current values for the definition of pulse widths.

An interval T1 is provided between the first pulse 91 and the second pulse 92. The current value of the write current Iw in the interval T1 is substantially 0. The interval T1 is smaller than the pulse width W1 of the first pulse 91. For example, the interval T1 is preferably equal to or more than the pulse width W2 of the second pulse 92. The interval T1 has a magnitude within the range between 5% or more of the pulse width W1 and 75% or less of the pulse width W1. If, for example, the pulse width W1 is 100 ns, the interval T1 is 5 ns or more and 75 ns or less. In this case, more preferably, the interval T1 is between 30 ns and 50 ns. Note, however, that the interval T1 is sometimes smaller than the pulse width W2.

At time t1, the pulse 91 starts to rise. At time t2, the current value of the pulse 91 reaches "i0". In the period from time t2 and time t3, the current value of the pulse 91 is maintained at "i0". At time t3, the pulse 91 starts to fall. At time t4, the current value of the pulse 91 becomes 0.

In the period from time t4 to time t5, it is preferable that the current value of the write current Iw is substantially 0. Assuming that the control circuit 20 is implemented by a transistor, in this case, in the period from time t4 to time t5, the current value of the write current Iw may be determined in accordance with the leak current of the transistor and can be set within the range between, for example, 10% or less of +i0 and 10% or more of −i0.

At time t5, the pulse 92 starts to rise. At time t6, the current value of the pulse 92 reaches "i0". In the period from time t6 to time t7, the current value of the pulse 92 is maintained at "i0". At time t7, the pulse 92 starts to fall. At time t8, the current value of the pulse 92 becomes 0.

The period from time t5 to time t8 is shorter than the period from time t1 to time t4. The interval from time t6 to time t7 is shorter than the interval from time t2 to time t3.

Note that the current values of the pulses 91 and 92 sometimes overshoot to "i0" or more at the leading edges of the pulses 91 and 92.

In the case in FIG. 3, the current values of the pulses 91 and 92 of the write current Iw are indicated by absolute values. Note, however, that the write current Iw has positive polarity (positive current value) or negative polarity (negative current value) in accordance with the data written in the magnet 100.

For example, at the time of writing first data (for example, "0" data), the write current Iw having positive polarity is supplied to the field line FL. At the time of writing second data (for example, "1" data) different from the first data, the write current Iw having negative polarity is supplied to the field line FL. The flowing direction of the write current Iw for writing the second data in the field line FL is opposite to the flowing direction of the write current Iw for writing the first data in the field line FL.

<Principle>

A phenomenon that occurs due to the supply of the write current Iw to the field line FL in the magnetic memory 1 according to this embodiment will be described with reference to FIGS. 4 and 5.

FIG. 4 schematically shows a phenomenon that occurs in the magnet 100 due to the write current Iw including the plurality of pulses 91 and 92 in this embodiment. FIG. 5 is a graph schematically showing the temperature state of the magnet 100. In the graph of FIG. 5, the abscissa corresponds to the time. In the graph of FIG. 5, the ordinate corresponds to the normalized temperature. FIG. 5 shows the pulse waveform of the write current Iw for comparison with a change in the temperature of the magnet 100. In the write current Iw in the case of FIG. 5, the pulse width of the first pulse 91 is set to 100 ns, the pulse width of the second pulse 92 is set to 20 ns, and the interval T1 between the two pulses 91 and 92 is set to 30 ns. The current value i0 of each of the pulses 91 and 92 is 19 mA.

As indicated by "(a)" in FIG. 4, before the start of a write operation, the write area 101 of the magnet 100 has a magnetization 199 in a given direction.

When a write operation starts, the write current Iw is supplied to the field line FL. Of the plurality of pulses 91 and 92 included in the write current Iw, the first pulse 91 flows in the field line FL. When the write current Iw is supplied, the field line FL generates heat. The temperature of the field line FL rises.

When the first pulse 91 is supplied, a write field is generated in the field line FL. The generated write field is applied to the write area 101 of the magnet 100.

As shown in FIG. 5, the temperature of the magnet 100 changes in accordance with the supply of a current to the field line FL (the application of a generated write field). The temperature of the magnet 100 (the write area 101) rises in accordance with the start of the supply of the first pulse 91 to the field line FL.

As indicated by "(b)" in FIG. 4, the applied write field aligns the direction of the magnetization 199 of the write area 101 with the direction of the write field. For example, the direction of the magnetization of the write area 101 is inverted from the direction of the magnetization in the initial state.

At given time tx during the supply of the first pulse 91 of the write current Iw, the temperature of the write area 101 becomes high, exceeding a given threshold temperature (critical temperature) Qa due to the supply of the first pulse 91.

When a period corresponding to the pulse width W1 of the first pulse 91 elapses, the supply of the first pulse 91 is stopped. When the supply of the first pulse 91 is stopped to make the current value of the write current Iw become 0, the write field disappears.

As indicated "(c)" in FIG. 4, when the supply of the first pulse 91 is stopped to make the magnetic field applied to the magnet 100 become 0, the magnetic field in the write area 101 in a high temperature state fluctuates. As a result, the anisotropy of a magnetization 199x in the write area 101 of the magnet 100 disappears.

In the interval T1 between the two pulses 91 and 92, the temperature of the write area 101 drops to the threshold temperature Qa or less. In the interval T1, the magnetization in the write area 101 is saturated. As indicated by "(d)" in FIG. 4, the direction of the magnetization 199 in the write area 101 becomes unstable in accordance with the influence of the magnetic field fluctuation.

After the lapse of the interval T1 since the stop of the supply of the first pulse 91, the second pulse 92 flows in the field line FL.

When the second pulse 92 is supplied, a write field is generated again around the field line FL. The generated write field is applied to the write area 101.

When the write field generated by the supply of the second pulse 92 is applied, the temperature of the write area 101 rises again.

As indicated by "(e)" in FIG. 4, the direction of the magnetization 199 of the write area 101 is set to a direction corresponding to the direction of the write field generated by the second pulse 92.

When a period corresponding to the pulse width W2 of the second pulse 92 elapses, the supply of the second pulse 92 is stopped. As a result, the write field applied to the write area 101 disappears.

In the supply period of the second pulse 92 which corresponds to the pulse width W2, the pulse width W2 is smaller than the pulse width W1, and hence the temperature of the write area 101 does not exceed the threshold temperature Qa. At the time of supplying the second pulse 92, the temperatures of the field line FL and the write area 101 do not become high. Accordingly, at the time of supplying the second pulse 92, the magnetization 199 of the write area 101 is fixed to a direction corresponding to the direction of the write field without the occurrence of the fluctuation of the magnetic field of the magnet 100 in a high temperature state.

In this manner, at the time of supplying the second pulse 92, the direction of the magnetization 199 in the write area 101 is set to a direction corresponding to data to be written at a relatively low temperature.

As described above, the magnetic memory 1 according to this embodiment can write predetermined data by using the write current Iw including the two pulses 91 and 92.

According to this embodiment, even if a write error occurs with a given probability when the first pulse 91 is supplied, the second pulse 92 is supplied to write data in the magnet 100 while the high temperature rising of the magnet 100 is suppressed.

Accordingly, the magnetic memory 1 according to this embodiment can suppress the occurrence of a write error due to a rise in the temperature of the magnet 100.

(b-2) Operation Sequence

FIG. 6 is a timing chart for explaining the operation sequence of the magnetic memory according to this embodiment.

One cycle in the operation sequence includes a write operation, a shift operation, and a read operation. In each cycle, a plurality of operations are executed in the order of a write operation, a shift operation, and a read operation.

As shown in FIG. 6, at the time of the execution of a given cycle SY1, the magnetic memory 1 according to this embodiment executes a write operation. The control circuit 20 causes the write current Iw including the plurality of pulses 91, 92, and 93 to flow in the field line FL.

In the case in FIG. 6, a write current Iw-1 includes three pulses 91*p*, 92*p*, and 93*p*. For example, when "0" data is to be written in the write area 101, the write current Iw-1 has positive polarity.

At the time of supplying the write current Iw-1, after a pulse 91*p* is supplied to the field line FL, a pulse 92*p* is supplied into the field line FL. After the pulse 92*p* is supplied, a pulse 93*p* is supplied into the field line FL. The pulse width W2 of the pulse 92*p* is smaller than the pulse width W1 of the pulse 91*p*. A pulse width W3 of the pulse 93*p* is smaller than the pulse width W1 of the pulse 91*p* and the pulse width W2 of the pulse 92*p*. The pules 91*p*, 92*p*, and 93*p* have substantially the same current value. The interval T1 with a given magnitude is provided between the pulse 91*p* and the pulse 92*p*. An interval T2 with a given magnitude is provided between the pulse 92*p* and the pulse 93*p*. For example, the interval T2 is equal to or less than the interval T1.

Supplying the write current Iw-1 including the three pulses 91*p*, 92*p*, and 93*p* will write predetermined data ("0" data in this case) in the write area 101 based on the above principle.

Following the write operation, the magnetic memory 1 according to this embodiment executes a shift operation. The control circuit 20 causes the shift current Is including one pulse to flow in the magnet 100. The shift current Is has positive polarity.

As a domain wall is displaced upon supply of the shift current Is, the data in the write area 101 and the data in the cell area 103 move, for example, a distance corresponding to the size of one cell area 103 from the write area 101 side to the read area 102 side.

After the shift operation, the magnetic memory 1 according to this embodiment executes a read operation. The control circuit 20 supplies the read current Ir including one pulse to the MTJ element 120 as a read element. The read current Ir has positive polarity. The maximum current value of the read current Ir is smaller than the maximum current value of the shift current Is.

Supplying the read current Ir to the MTJ element 120 will read the data in the read area 102.

After a read operation in a given cycle SY1, the magnetic memory 1 according to this embodiment executes a write operation in another cycle SY2. The control circuit 20 causes a write current Iw-2 to flow in the field line FL. When "1" data is to be written in the write area 101, the write current Iw-2 has negative polarity. The write current Iw-2 flows in a direction opposite to the flowing direction of the write current Iw-1. The write current Iw-2 includes three pulses 91*n*, 92*n*, and 93*n* with negative polarity. The direction of the magnetic field generated by the write current Iw-2 is opposite to the direction of the magnetic field generated by the write current Iw-1.

At the time of supplying the write current Iw-2, the pulse 92*n* is supplied into the field line FL after the pulse 91*n* is supplied into the field line FL. After the pulse 92*n* is supplied, the pulse 93*n* is supplied into the field line FL. The pulse width W2 of the pulse 92*n* is smaller than the pulse width W1 of the pulse 91*n*. The pulse width W3 of the pulse 93*n* is smaller than the pulse width W1 of the pulse 91*n* and the pulse width W2 of the pulse 92*p*. The pulses 91*n*, 92*n*, and 93*n* have substantially the same current value. The interval T1 with a given magnitude is provided between the pulse 91*n* and the pulse 92*n*. The interval T2 equal to or less than the interval T1 is provided between the pulse 92*n* and the pulse 93*n*.

Even if the polarity of the write current Iw is negative, supplying the write current Iw-2 including the three pulses 91*n*, 92*n*, and 93*n* will write predetermined data ("1" data in this case) in the write area 101 based on the above principle.

Following the write operation, the magnetic memory 1 according to this embodiment executes a shift operation. The control circuit 20 causes the shift current Is having positive polarity to flow in the magnet 100. As described above, with this operation, the data in the magnet 100 shifts to the read area 102 side.

After the shift operation, the magnetic memory 1 according to this embodiment executes a read operation. The control circuit 20 supplies the read current Ir having positive polarity to the MTJ element 120. With this operation, the data in the read area 102 is read in the above manner.

As described above, the magnetic memory 1 according to this embodiment executes one or more cycles, namely the cycles SY1 and SY2.

(c) Summary

The magnetic memory 1 according to this embodiment causes the write current Iw including the plurality of pulses 91 and 92 to flow in the field line FL at the time of a write operation.

FIG. 7 is a graph showing experimental results on the write operation of the magnetic memory according to this embodiment. Referring to the graph of FIG. 7, the abscissa indicates the voltage for generating a write current (to be referred to as a write voltage hereinafter). Referring to the graph of FIG. 7, the ordinate indicates the success rate of data write (to be referred to as a write probability hereinafter).

Referring to the graph of FIG. 7, the characteristic indicated by the black circle plot and the solid represents results on write operations using a write current including two pulses. The pulse width of the first pulse of the two pulses is set to 100 ns. The pulse width of the second pulse supplied after the first pulse is set to 15 ns. The interval between the first pulse and the second pulse is set to 20 ns.

Referring to the graph of FIG. 7, the characteristic indicated by the white rectangle plot and the solid line represents results on a write operation using a write current including one pulse. The pulse width of one pulse of the write current is set to 100 ns.

As the write voltage (write current) increases, the temperature of the magnet rises. Accordingly, as shown in FIG. 7, when the write current includes one pulse, the write probability decreases to lower than 100% due to the influence of magnetic field fluctuation in the magnet in a high temperature state as the write voltage increases.

In contrast to this, as in this embodiment, if a write current includes two pulses, the write probability is maintained at 100% by settings for magnetization in a low temperature state due to the supply of the second pulse having a small pulse width even if the write voltage increases.

As described above, the magnetic memory 1 according to this embodiment can suppress the occurrence of a write error even if a write field originating from a write current having a large current value is applied to the magnet due to the securement of the margin of the current value of the write current Iw or variations in the characteristics of the magnet.

Accordingly, the magnetic memory 1 according to this embodiment can improve the data write reliability using the plurality of pulses 91 and 92 of the write current Iw.

As described above, the magnetic memory 1 according to this embodiment can improve the reliability of the operation of the magnetic memory using domain wall displacement (domain wall movement).

(2) Second Embodiment

A magnetic memory according to the second embodiment will be described with reference to FIG. 8.

The polarity of a first pulse 91*x* of a write current Iw-2 for writing the second data is opposite to the polarity of a second pulse 92*n* of the write current Iw-2 for writing the second data. A pulse width W2 of the second pulse 92*n* is smaller than a pulse width W1 of the first pulse 91*x*. An interval T1 is provided between the two pulses 91*x* and 92*n*.

The polarity of the first pulse 91*x* of the write current Iw-2 for writing the second data is the same as the polarity of a first pulse 91*p* of a write current Iw-1 for writing the first data. The polarity of a second pulse 92*p* of the write current Iw-1 for writing the first data is the same as the polarity of the first pulse 91*p*.

The pulse width W1 of the pulse 91*x* is substantially equal to the pulse width W1 of the pulse 91*p*. The absolute value of the current value (+i0) of the pulse 91*x* is substantially equal to the absolute value of the current value (+i0) of the pulse 91*p*. The pulse width W2 of the pulse 92*n* is substantially equal to the pulse width W2 of the pulse 92*p*. The absolute value of the current value (−i0) of the pulse 92*n* is substantially equal to the absolute value of the current value (+i0) of the pulse 92*p*.

As described above, the first pulse 91*x* acts to raise the temperature of a magnet 100 and fluctuate the magnetic field of the magnet 100. Since the second pulse 92*n* substantially determines the direction of the magnetization in the magnet 100, the polarity of the first pulse 91*x* may not contribute to the determination of data to be written. For example, the first pulse 91*x* may act to temporarily relax the magnetic field in the magnet 100.

Accordingly, as in this embodiment, if the second pulse 92*n* has polarity corresponding to the data to be written, the first pulse 91*x* may not have polarity corresponding to the data to be written.

According to this embodiment, it is possible to eliminate the necessity to design and place a circuit for generating the first pulse 91*x* having negative polarity. This enables the magnetic memory 1 according to this embodiment to suppress an increase in the manufacturing cost of a magnetic memory.

The magnetic memory 1 according to this embodiment can improve the reliability of data write even if the polarity of the first pulse 91 is different from the polarity of the second pulse 92.

(3) Third Embodiment

A magnetic memory according to the third embodiment will be described with reference to FIGS. 9 and 10.

Figure 10:
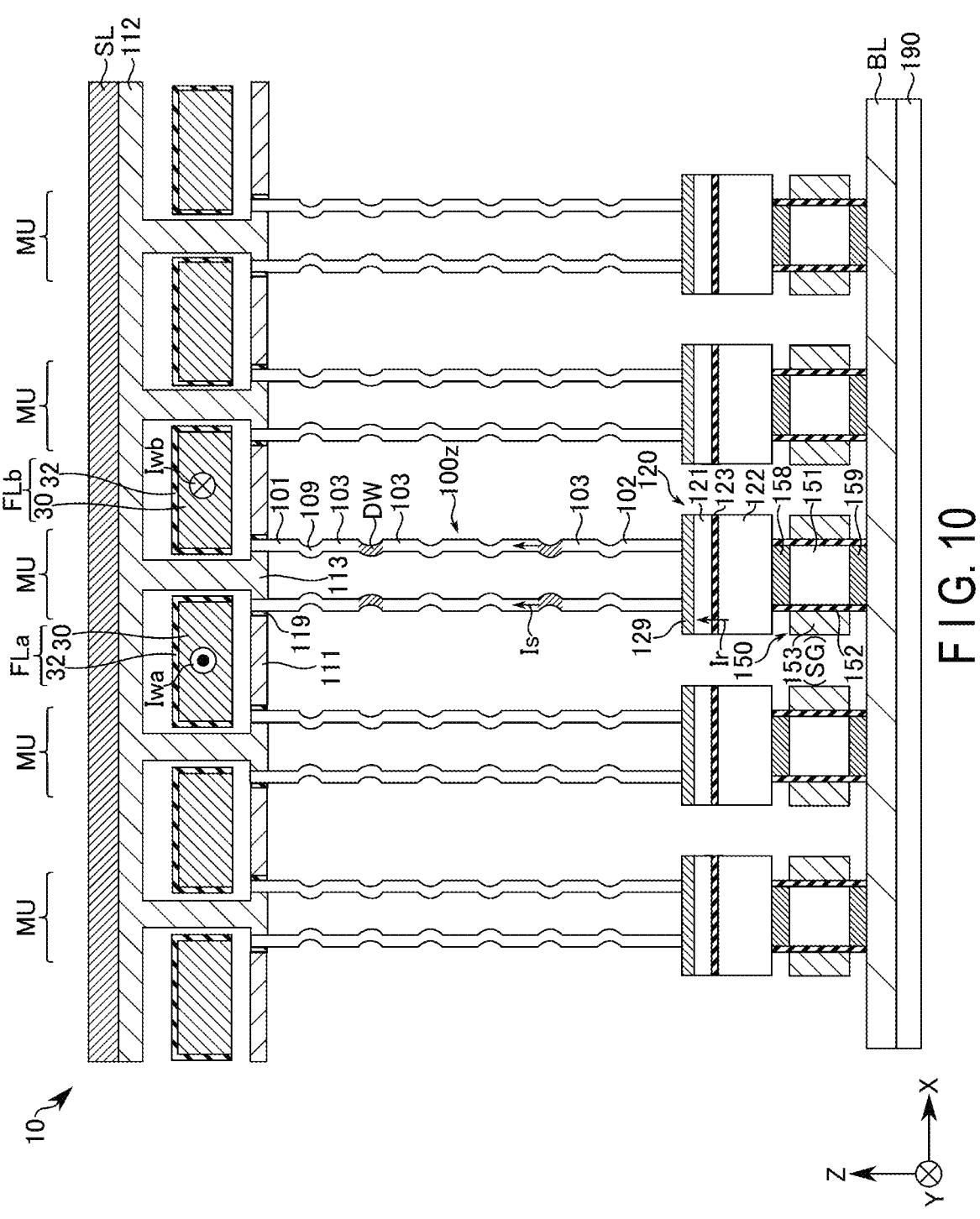
FIG. 10 is a sectional view showing an example of the structure of the magnetic memory according to the third embodiment.

FIGS. 9 and 10 are schematic views showing an example of the structure of the magnetic memory 1 according to this embodiment.

FIG. 9 is a plan view of a memory core circuit 10 in the magnetic memory according to this embodiment when seen from a direction perpendicular to the surface of the substrate. FIG. 10 is a sectional view showing a section taken along line A-A in FIG. 9. Referring to FIG. 9, a partial region of the memory core circuit 10 is extracted and shown.

As shown in FIGS. 9 and 10, the memory core circuit 10 includes a plurality of magnets 100*z*. In a plurality of memory units MU, the plurality of magnets 100*z* are two-dimensionally arrayed in a plane (X-Y plane) parallel to the surface of a substrate 190. Each magnet 100*z* extends in a direction (Z direction) perpendicular to the surface of the substrate 190. The magnet 100*z* has a structure with a tubular shape (for example, a cylindrical tubular shape or elliptic tubular shape).

A plurality of cell areas 103 are provided in the magnet 100*z*. The plurality of cell areas 103 are arranged in the Z direction. A write area 101 is provided on the upper end (one end) side of the magnet 100*z* in the Z direction. A read area 102 is provided on the lower end (other end) side of the magnet 100*z* in the Z direction.

In the magnet 100*z*, constricted portions 109 are provided between adjacent twos of the areas 101, 102, and 103 in the Z direction. The dimension (the diameter of the tube) of the constricted portion 109 in a direction parallel to the surface of the substrate 190 is smaller than the dimension (the diameter of the tube) of the cell area 103 in a direction parallel to the surface of the substrate 190. The dimension of the constricted portion 109 in the Z direction is smaller than the dimension of the cell area 103 in the Z direction.

A yoke (magnet) 111 is located adjacent to the outer surface of the upper end portion of the magnet 100*z* through an insulating layer 119. The yoke 111 faces the lower surface of a field line FL in the Z direction.

A yoke (magnet) 112 is provided above the magnet 100*z* in the Z direction. The yoke 112 may extend in the x direction or may planarly extend in the x direction and the y direction.

A yoke (magnet) 113 is provided between the magnet 100*z* and the yoke 112 in the Z direction. The yoke 113 has a columnar structure. The yoke 113 extends in the tube of the magnet 100*z*. The yoke 113 comes into contact with the inner surface of the upper end portion of the magnet 100*z*. The yokes 112 and 113 are continuous members. The yokes 111, 112, and 113 form a magnetic circuit.

The upper end portion of the magnet 100*z* (part of the write area 101) in the Z direction is sandwiched between the yoke 111 and the yoke 113. A magnetic gap is provided between the yoke 111 and the yoke 113. This magnetic gap functions as a magnetic resistance in the magnetic circuit.

The insulating layer 119 is provided between the magnet 100*z* and the yoke 111. An insulator may be provided in the tube of the magnet 100*z*.

The field lines FL (FLa and FLb) extend in the Y direction. The field line FL is provided in the space between the yoke 111 and the yoke 112. The two field line FL sandwich the yoke 113 in the X direction. The field line FL is surrounded by the yokes 111, 112, and 113. The field line FL includes a metal interconnect 30 and an insulating layer 32. The surfaces of the metal interconnect 30 other than the surface on the magnet 100*z* side are covered by the insulating layer 32. The metal interconnect 30 may be entirely covered by the insulating layer 32. The insulating layer 32 comes into direct contact with the metal interconnect 30.

A source line (plate electrode) SL may extend in the X direction or may planarly extend in the x direction and the y direction. The source line SL is provided on the upper surface of the yoke 112.

An MTJ element 120 as a read element is provided between the lower end portion of the magnet 100*z* and the substrate 190 in the Z direction. A storage layer 121 is connected to the lower end portion (the read area 102) of the magnet 100*z* through a nonmagnetic conductive layer 129. A reference layer 123 is provided between the storage layer 121 and the substrate 190. A tunnel barrier layer 122 is provided between the storage layer 121 and the reference layer 123.

A bit line BL is provided between the MTJ element 120 and the substrate 190. The bit line BL extends in the x direction. The bit line BL is electrically connected to the plurality of MTJ elements 120 arranged in the x direction.

In each memory unit MU, a select transistor 150 may be provided between the MTJ element 120 and the bit line BL. The select transistor 150 is a vertical thin film transistor (TFT). ON/OFF-controlling the select transistor 150 will control electrical connection and separation between the MTJ element 120 and the bit line BL. A control circuit 20 performs ON/OFF control of the select transistor 150.

The select transistor 150 includes a semiconductor layer 151, a gate insulating layer 152, and a gate electrode 153. The semiconductor layer 151 extends in the Z direction. The semiconductor layer 151 functions as the channel region of the transistor. One end and the other end of the semiconductor layer 151 are respectively provided with source/drain regions. One end of the semiconductor layer 151 is electrically connected to the reference layer 123 through a non-magnetic conductive layer 158. The other end of the semiconductor layer 151 is electrically connected to the bit line BL through a non magnetic conductive layer 159.

The gate insulating layer 152 covers a side surface of the semiconductor layer 151 in a direction parallel to the surface of the substrate 190.

The gate electrode 153 faces a side surface of the semiconductor layer 151 through the gate insulating layer 152. The gate electrode 153 extends in the Y direction. The gate electrode 153 is shared by the plurality of select transistors 150 arranged in the Y direction. The gate electrode 153 functions as a select gate line SG. The control circuit 20 can collectively set the plurality of memory units MU connected to one select gate line SG in a selected state by controlling the select gate line SG.

At the time of a shift operation, in the memory unit MU including the select transistor 150 in an ON state, a shift current Is flows in the magnet 100z. Supplying the shift current Is will displaces a domain wall DW from a given constricted portion 109 to another constricted portion 109. While the shift current Is is not supplied to the magnet 100z, the domain wall DW is located at the constricted portion 109.

At the time of a read operation, the select transistor 150 corresponding to the selected memory unit MU is set in an ON state. A read current Ir flows between the bit line BL and the source line SL through the MTJ element 120, the magnet 100z, and the yokes 112 and 113. The data in the read area 102 is read based on variations in current and voltage which correspond to the resistance state of the MTJ element 120.

At the time of a write operation, as in another embodiment described above, a write current Iw (Iwa, Iwb) including a plurality of pulses 91 and 92 is supplied to the field line FL (FLa, FLb).

In this embodiment, the control circuit 20 causes a write current Iwa corresponding to the data to be written and flowing in the first direction to flow in one or more field lines FLa located at one end side of the yoke 113 of the selected memory unit MU. At the same time as the supply of the write current Iwa, the control circuit 20 causes a write current Iwb flowing in the second direction opposite to the first direction to flow in one or more field lines FLb located at the other end side of the yoke 113 of the selected memory unit MU. When the write currents Iw are respectively caused to flow in the plurality of field lines FL, each write current Iw is divided and supplied to the respective field line FL.

A magnetic circuit is formed in the yokes 111, 112, and 113 around the field line FL in which the write current Iw flows. This prevents a deterioration in the strength of a write field even if the write current Iw is divided and supplied to the plurality of field lines FL.

The above arrangement enables the magnetic memory 1 according to this embodiment to avoid the magnetic saturation of the yokes 111, 112, and 113 at the time of a write operation.

Assume that the write current Iw is divided into a plurality of currents, and the divided currents are respectively caused to flow in the respective field lines FL. In this case, the magnetic memory 1 according to this embodiment can reduce the current value of a current supplied to one field line FL. This enables the magnetic memory 1 according to the embodiment to suppress the occurrence of electromigration in the field line FL. As a result, the magnetic memory 1 according to the embodiment can suppress the disconnection of the field line FL.

As in this embodiment, even if the memory core circuit 10 has a three-dimensional structure, the magnet 100z extending in a direction perpendicular to the surface of the substrate 190 allows the write current Iw including the plurality of pulses 91 and 92 to be used for the write operation of the magnetic memory 1.

Therefore, the magnetic memory 1 according to this embodiment can improve the reliability of data write.

(4) Others

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory comprising:
   a magnet configured to store data and shift the data from a first area to a second area by domain wall movement caused by a shift operation;
   a first interconnect spaced apart from the magnet and configured to apply a first write field to the magnet at a time of a write operation; and
   a control circuit configured to cause a shift current for shifting the data to flow in the magnet and to cause a write current for generating the first write field to flow in the first interconnect,
   wherein the write current includes a first pulse supplied to the first interconnect and a second pulse supplied to the first interconnect after the first pulse, and
   a pulse width of the second pulse is smaller than a pulse width of the first pulse.

2. The magnetic memory according to claim 1, wherein a first interval is provided between the first pulse and the second pulse, and
   the first interval is smaller than the pulse width of the first pulse and is not less than the pulse width of the second pulse.

3. The magnetic memory according to claim 1, wherein a current value of the second pulse is equal to a current value of the first pulse.

4. The magnetic memory according to claim 1, wherein a current value of the second pulse has a value within a range from a value 10% lower than the current value of the first pulse to a value 10% higher than the current value of the first pulse.

5. The magnetic memory according to claim 1, wherein the pulse width of the second pulse has a magnitude within a range not less than 25% of the pulse width of the first pulse and not more than 30% of the pulse width of the first pulse.

6. The magnetic memory according to claim 5, wherein a first interval is provided between the first pulse and the second pulse, and the first interval has a magnitude within a range not less than 5% of the pulse width of the first pulse and not more than 75% of the pulse width of the first pulse.

7. The magnetic memory according to claim 1, wherein the first interconnect includes a metal interconnect and a thermal resistance layer covering the metal interconnect.

8. The magnetic memory according to claim 1, wherein the first pulse and the second pulse each have first polarity at a time of writing first data, and the first pulse and the second pulse each having second polarity different from the first polarity at a time of writing second data different from the first data.

9. The magnetic memory according to claim 1, wherein each of the first pulse and the second pulse has first polarity at a time of writing first data, and the first pulse has the first polarity and the second pulse has second polarity different from the first polarity at a time of writing second data different from the first data.

10. The magnetic memory according to claim 1, wherein the magnet is provided on a substrate and extends in a first direction perpendicular to a surface of the substrate.

11. The magnetic memory according to claim 10, further comprising:

a second interconnect spaced apart from the magnet and arranged side by side with the first interconnect in a second direction parallel to a surface of the substrate, the second interconnect configured to apply a second write field to the magnet at the time of the write operation; and a yoke surrounding the first interconnect and the second interconnect and including a portion provided between the first interconnect and the second interconnect, the portion provided above the magnet in the first direction.

12. The magnetic memory according to claim 11, wherein the write current includes a first current flowing in the first interconnect and a second current flowing in the second interconnect, and a flowing direction of the first current is opposite to a flowing direction of the second current.

13. The magnetic memory according to claim 11, further comprising:

a read element provided between the substrate and the magnet in the first direction and configured to read the data in the magnet at a time of a read operation;

a source line provided on the yoke;

a transistor provided between the substrate and the read element; and a bit line provided between the substrate and the transistor.

14. The magnetic memory according to claim 1, wherein the magnet is provided on a substrate and extends in a first direction parallel to a surface of the substrate.

15. The magnetic memory according to claim 14, further comprising:

a read element provided on an one end of the magnet in the first direction and configured to read the data in the magnet at a time of a read operation;

a bit line connected to the one end of the magnet through the read element;

a source line connected to an other end of the magnet in a first direction, and wherein the first interconnect is provided on a side of the other end of the magnet.

16. The magnetic memory according to claim 1, wherein the magnet is provided on a substrate and extends in a first direction, the magnet includes a first portion between the first area and the second area in the first direction, and a dimension of the first portion in a second direction intersecting the first direction is smaller than a dimension of the first area in the second direction and a dimension of the second area in the second direction.

\* \* \* \* \*